United States Patent [19]

Kapetanic

[11] Patent Number: 5,019,790
[45] Date of Patent: May 28, 1991

[54] METHOD FOR ELIMINATING SUBHARMONIC FALSE LOCKING IN SAMPLER AND FREQUENCY MULTIPLIER BASED SOURCE LOCKING SYSTEMS

[75] Inventor: Peter M. Kapetanic, Morgan Hill, Calif.

[73] Assignee: Wiltron Company, Morgan Hill, Calif.

[21] Appl. No.: 541,586

[22] Filed: Jun. 21, 1990

[51] Int. Cl.⁵ .......................... H03L 7/10; H03L 7/16
[52] U.S. Cl. .......................................... 331/16; 331/18
[58] Field of Search ..................... 331/2, 4, 14, 16, 18, 331/25, 30, 31; 375/120; 455/260

[56] References Cited

U.S. PATENT DOCUMENTS 4,882,549 11/1989 Galani et al. ........................ 331/14

Primary Examiner—David Mis
Attorney, Agent, or Firm—Fliesler, Dubb, Meyer & Lovejoy

[57] ABSTRACT

A method for eliminating subharmonic false locking in a sampler and frequency multiplier phase-locked-loop source locking system comprising the modification of a prior known algorithm for determining the frequency of the first local oscillator used for controlling the sampling of the output of a source voltage controlled oscillator. The frequency of the first local oscillator is determined using prior algorithms for determining the lowest usable harmonic number H and the highest usable first oscillator frequency which will maximize sampler efficiency and minimize local oscillator phase noise due to frequency multiplication. Thereater, the harmonic number H as thus determined is modified depending upon whether when divided by a multiplication factor M, where M is the factor by which the frequency of the VCO is multiplied, the remainder thereof is equal to 1/M, 2/M or zero. If the remainder of the division step is zero, then H is increased by one. If the remainder of the division step is equal to 2/M, then H is increased by two. If the remainder of the division step is equal to 1/M, then the magnitude of H as initially calculated is not adjusted. After H has been calculated and, if necessary, adjusted as described above, it is then used to calculate the first local oscillator frequency using the remaining steps in the prior known algorithm.

6 Claims, 3 Drawing Sheets

METHOD FOR ELIMINATING SUBHARMONIC FALSE LOCKING IN SAMPLER AND FREQUENCY MULTIPLIER BASED SOURCE LOCKING SYSTEMS

BACKGROUND OF THE INVENTION

1. Field of the Invention

The present invention relates to vector network analyzers in general and in particular to a method for eliminating subharmonic false locking in a sampler and frequency multiplier based phase-locked-loop signal source locking system which is used for generating an r.f. signal for use in such analyzers.

2. Description of the Prior Art

Vector network analyzers require an accurate and stable signal source to generate the r.f. signals used for testing and analyzing the electrical characteristics of an electrical circuit. When being analyzed the circuit is commonly called a device-under-test or DUT.

A sampler based source locking system, of the type used as a signal source in a vector network analyzer, allows an open loop source with a maximum frequency error of $\pm F_{error}$ to be phase-locked to a more accurate and stable reference signal. For example, in a typical prior known sampler based source locking system there is provided a source comprising a voltage-controlled oscillator (VCO) having an output coupled to a frequency multiplier for providing an output signal having a nominal fundamental frequency $F_s$. The output of the source is coupled to a sampler which is driven by a first local oscillator having a frequency $F_{LO1}$. On the output of the sampler there is produced a first intermediate frequency signal having an intermediate frequency $IF_1$ which is equal to the difference between the frequency of the source $F_s$ and a harmonic frequency or comb line of the first local oscillator. For convenience, the harmonic frequency is often defined by a harmonic number (H). The harmonic number H is the integer by which the frequency $F_{LO1}$ of the oscillator is multiplied to obtain the harmonic frequency, e.g. 531.75 MHz $\times$ H = 60087.75 MHz, where H = 113.

The first intermediate frequency signal $IF_1$ is then fed to a mixer and mixed with the output of a second local oscillator to produce a second intermediate frequency signal having an intermediate frequency $IF_2$. The output of the mixer is then fed to a phase detector along with a reference signal having a frequency $F_{ref}$. The output of the phase detector, which comprises an error signal having a magnitude corresponding to the difference between $IF_2$ and $F_{ref}$, is then used to control the frequency of the VCO so as to maintain the second intermediate frequency $IF_2$ at $F_{ref}$.

Alternatively, the mixer stage may be omitted. In this event the first intermediate frequency $IF_1$ is compared in the phase detector with an appropriate alternative reference frequency $F_{ref}$ to maintain the frequency $IF_1$ at the alternative reference frequency $F_{ref}$.

Heretofore it has been the practice to select for the first local oscillator the lowest usable harmonic number (H) and the highest usable local oscillator frequency $F_{LO1}$ in order to maximize sampler efficiency and minimize local oscillator phase noise due to frequency multiplication. A typical algorithm which has been used for this purpose is as follows

| 10 | $F_1 = \text{INT} (20 \times F_s)$ |
|----|----|
| 20 | $H = 1 + \text{INT} (F_1 + 1788)/10730$ |
| 30 | $Z = 5365/(3 + H/1250)$ |
| 40 | $A = 1 + \text{INT} [(F_1 + Z)/H]$ |
| 50 | $K = (H \times A - F_1 + 45)$ |
| 60 | $F_{LO1} = A \times .05$ |
| 70 | $F_{LO2} = K \times .05$ |
| 80 | $IF_1 = H \times F_{LO1} - F_s$ | wherein

INT is the integer value of the parenthetical terms associated therewith $F_s$ is the fundamental output frequency of the source H is the harmonic number of the first local oscillator $F_{LO1}$ and $F_{LO2}$ are the frequencies of the first and second local oscillators $IF_1$ is the first intermediate frequency and $F_1$, Z, A and K are parameters used in calculating the above quantities Using the above algorithm and assuming a fundamental source frequency $F_s$ of 60 GHz, i.e. 60000 MHz, the lowest harmonic number H, the highest first and second local oscillator frequencies $F_{LO1}$ and $F_{LO2}$, respectively, and the first intermediate frequency $IF_1$ in megahertz which can be used to lock the source within its search range of $\pm F_{error}$, typically $\pm 60$ MHz, is calculated as follows:

10  $F_1 = \text{INT} (20 \times F_s)$
    $F_1 = \text{INT} (20 \times 60000)$
    $F_1 = 1200000$
20  H (HARMONIC NUMBER) $= 1 + \text{INT}(F_1 + 1788)/10730$ $$H = 1 + \text{INT} \frac{(1200000 + 1788)}{10730}$$

$$H = 1 + \text{INT} \frac{1201788}{10730}$$

$H = 1 + \text{INT} (112.0026)$
   $H = 1 + 112$
   $H = 113$
30 $Z = 5365/(3 + H/1250)$
   $Z = 5365/(3 + 113/1250)$
   $Z = 5365/(3 + 0.0904)$
   $Z = 5365/3.0904$
   $Z = 1736.02$
40 $A = 1 + \text{INT} [F_1 + Z)/H]$
   $A = 1 + \text{INT} [(1200000 + 1736.02)/113]$
   $A = 1 + \text{INT} [10634.83]$
   $A = 1 + 10634$
   $A = 10635$
50 $K = (H \times A - F_1 + 45)$
   $K = (113 \times 10635 - 1200000 + 45)$
   $K = (1201755 - 1200000 + 45)$
   $K = 1800$
60 $F_{LO1} = A \times .05$
         $= 10635 \times .05$
   $F_{LO1} = 531.75$ MHz
70 $F_{LO2} = K \times .05$
   $F_{LO2} = 1800 \times .05$
   $F_{LO2} = 90$ MHz
80 $IF_1 = H \times F_{LO1} - F_s$
   $IF_1 = 113 \times 531.75 - 60000$
   $IF_1 = 60087.75 - 60000$
   $IF_1 = 87.75$ If the source uses a frequency multiplier to generate the final r.f. energy, as many of them do, its output will also contain subharmonic frequencies which will mix with lower harmonic comb lines of the sampler. This can result in subharmonic false locking of the phase-locked-loop. For example, a source comprising a frequency tripler having a nominal fundamental output frequency $F_s$ of 60 GHz, i.e. 60000 MHz, a maximum frequency error signal, i.e. search range, of ±60 MHz, a first local oscillator frequency $F_{LO1}$ of 531.75 MHz and a first intermediate frequency $IF_1$ of 87.75 as calculated above, can, during searching for a lock, shift through a frequency range of from 59540 MHz to 60060 MHz. When this is done, it has been found that a false lock can occur at an output frequency $F_s$ of 59953.5 MHz producing a subharmonic false lock error of 46.5 MHz which is clearly within the permissible search range, i.e. ±60 MHz of the source. This is due to the fact that the second subharmonic of the source, i.e. 39969 MHz, will mix with the 75th harmonic, i.e. H=75, of the first local oscillator, i.e. 39881.25 MHz, in producing the intermediate frequency $IF_1$ of 87.5 MHz.

SUMMARY OF THE INVENTION

In view of the foregoing, a principal object of the present invention is a method for eliminating subharmonic false locking in a sampler and frequency multiplier based phased-locked-loop source locking system having a first local oscillator which is operated at a frequency such that the allowable source search range before subharmonic false locking occurs can be significantly increased.

In practice, the maximum source search range to guarantee proper locking must be equal to or greater than $2 \times F_{error}$, where $\pm F_{error}$ is the maximum open loop frequency error of the source.

In accordance with the present invention, to maximize the allowable source search range before subharmonic false locking occurs, it was found that an initial harmonic number H should be determined using the prior known above-described algorithm or a comparable algorithm which produces the lowest usable harmonic number H and the highest usable local oscillator frequency $F_{LO1}$ which maximizes sampler efficiency and minimizes local oscillator phase noise. Thereafter, the initial number H as determined by the algorithm is divided by M, where M is the multiplication factor used for the frequency multiplier, e.g. 3. If the remainder of the division step is equal to 0, then H is increased by 1. If the remainder of the division step is equal to ⅓, then H is increased by 2. If the remainder of the division step is equal to ⅔, then the magnitude of H as initially calculated is not adjusted. After H has been calculated and, if necessary, adjusted as described above, it is then used in the remaining steps of the algorithm to calculate a new frequency $F_{LO1}$ for the first local oscillator as well as the other parameters described.

In this manner, a sampler and frequency multiplier based phase-locked-loop source locking system can be built and operated free of subharmonic false locks over its entire source search range.

BRIEF DESCRIPTION OF THE DRAWINGS

The above and other objects, features and advantages of the present invention will become apparent from the following detailed description of the accompanying drawings, in which.

DETAILED DESCRIPTION OF THE INVENTION

Figure 1:
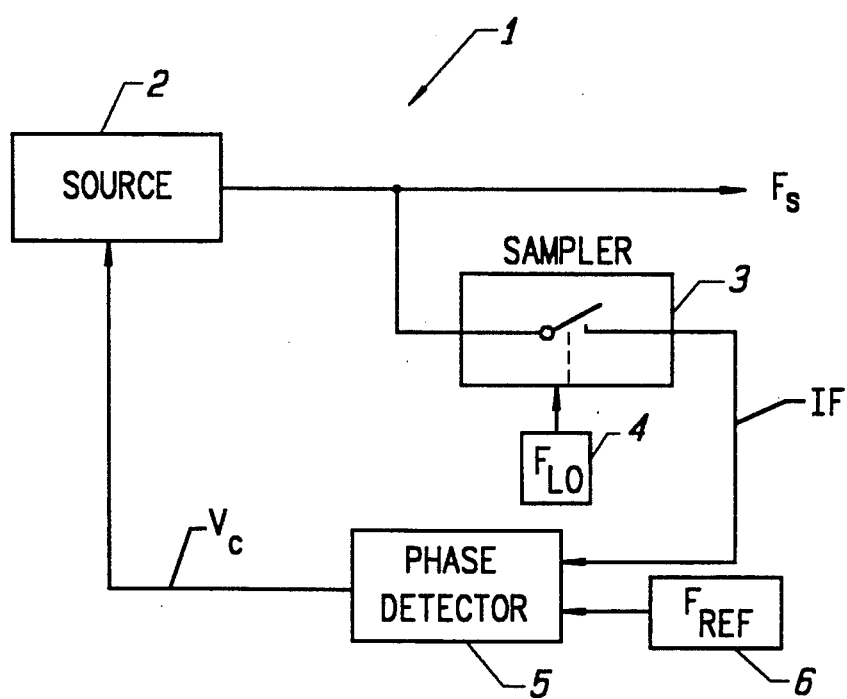
FIG. 1 is a generalized block diagram of a conventional source locking system.

Referring to FIG. 1, there is provided in a conventional phase-locked-loop source locking system designated generally as 1 a source 2, comprising a voltage controlled oscillator (VCO) for generating an output signal comprising a fundamental frequency $F_s$. Coupled to the output of the source 2 there is provided a sampler 3. Coupled to the sampler 3 there is provided a local oscillator 4. The local oscillator 4 drives the sampler 3 by means of a sampling signal having a local oscillator/sampling frequency $F_{LO}$. The output of the sampler which comprises an intermediate frequency signal having a frequency IF is compared in a phase detector 5 with a reference signal having a frequency $F_{ref}$ from a reference signal source 6. In practice, the intermediate frequency IF is equal to the difference between $F_s$ and a harmonic frequency/comb line of the local oscillator 4. The harmonic frequency, as defined above, is the product of the local oscillator frequency $F_{LO}$ and the harmonic number (H) of the oscillator 4. A difference between the intermediate frequency IF and the reference source frequency $F_{ref}$ produces an error signal in the form of an output control voltage $V_C$ on the output of the phase detector 5 which has a magnitude corresponding to the difference between the intermediate frequency IF and the reference frequency $F_{ref}$. The control voltage $V_C$ is then used for adjusting the frequency of the source 2 such that the error signal is reduced to zero.

Figure 2:
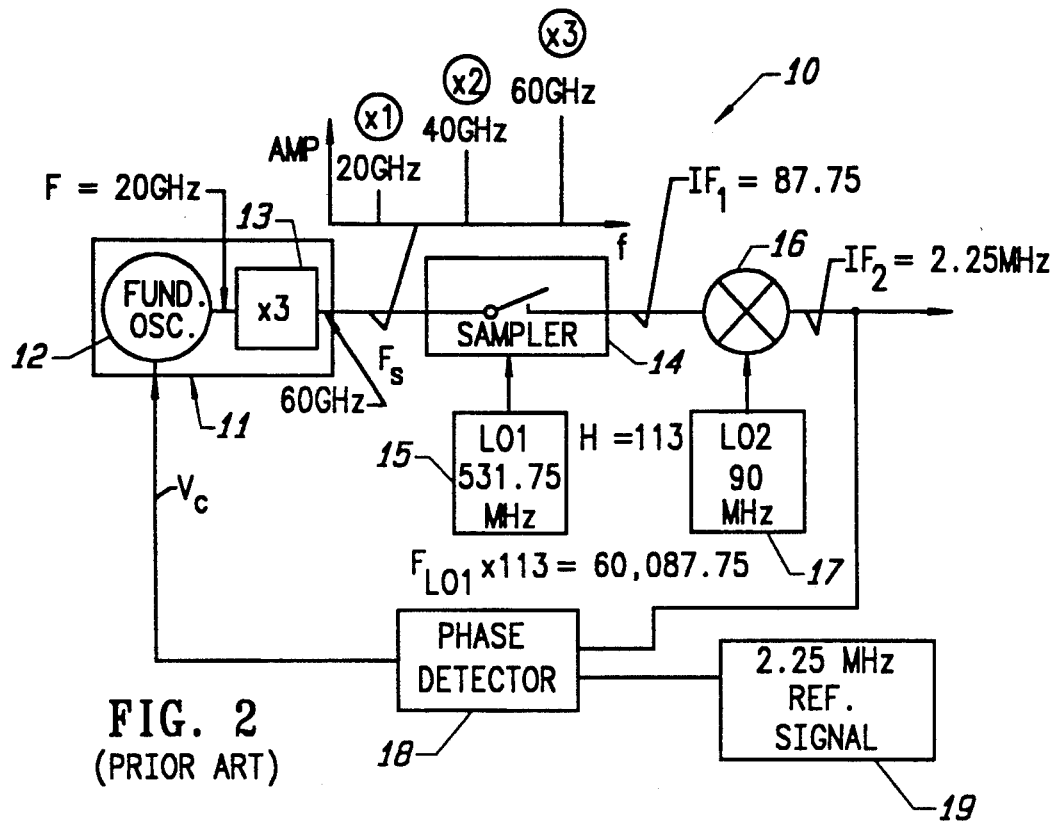
FIG. 2 is a block diagram of a prior known sampler and frequency multiplier based phase-locked-loop source locking system in which the first local oscillator comprises a frequency which produces a lock at the fundamental frequency of the source using the 113th harmonic of the oscillator.

Referring to FIG. 2, there is shown a conventional sampler and frequency multiplier based phase-locked-loop source locking system 10. In the system 10 there is provided a source 11 comprising a source oscillator 12 and a frequency multiplier 13 having a multiplication factor (M) of 3 for tripling the frequency of the oscillator 12. The output of the source 11, which is provided by the frequency multiplier 13, provides an output signal having a fundamental frequency $F_s$ of 60 (GHz) and subharmonic frequencies of 20 GHz and 40 GHz. The output of the source 11 is coupled to a sampler 14. The sampler 14 is provided with a first oscillator 15 having a first local oscillator frequency of 531.75 MHz. The output of the sampler is coupled to a mixer 16 and provides to the mixer 16 a first intermediate frequency ($IF_1$) of 87.75 MHz. The intermediate frequency $IF_1$ is equal to the difference between the fundamental frequency $F_s$ and the 113th harmonic of the first local oscillator 15. The intermediate frequency $IF_1$ is then mixed with a signal from a second local oscillator 17 having a local oscillator frequency $F_{LO2}$ of 90 MHz for producing a second intermediate frequency $IF_2$ of 2.25 MHz. The second intermediate frequency $IF_2$ is then compared in a phase detector 18 with a signal from a reference signal source 19. The reference signal comprises a frequency of 2.25 MHz. The output of the phase detector 18 comprises an error signal $V_C$ having a magnitude corresponding to the difference between the frequency of the reference signal and the magnitude of the second intermediate frequency $IF_2$ for controlling the source oscillator 12 so as to keep the second intermediate $IF_2$ at 2.25 MHz.

The lowest usable harmonic number H equal to 113 and the highest usable local oscillator frequency $F_{LO1}$ of 531.75 MHz was determined using the above described prior known algorithm in order to maximize sampler efficiency and minimize local oscillator phase noise due to frequency multiplication. As pointed out, however, the use of the prior known algorithm permits a subharmonic false lock over the typical search source range of the source 11. As is well known, the maximum source search range to guarantee proper locking must be equal to or greater than 2 times $F_{error}$, where $\pm F_{error}$ is the maximum open loop error of the source.

Figure 3:
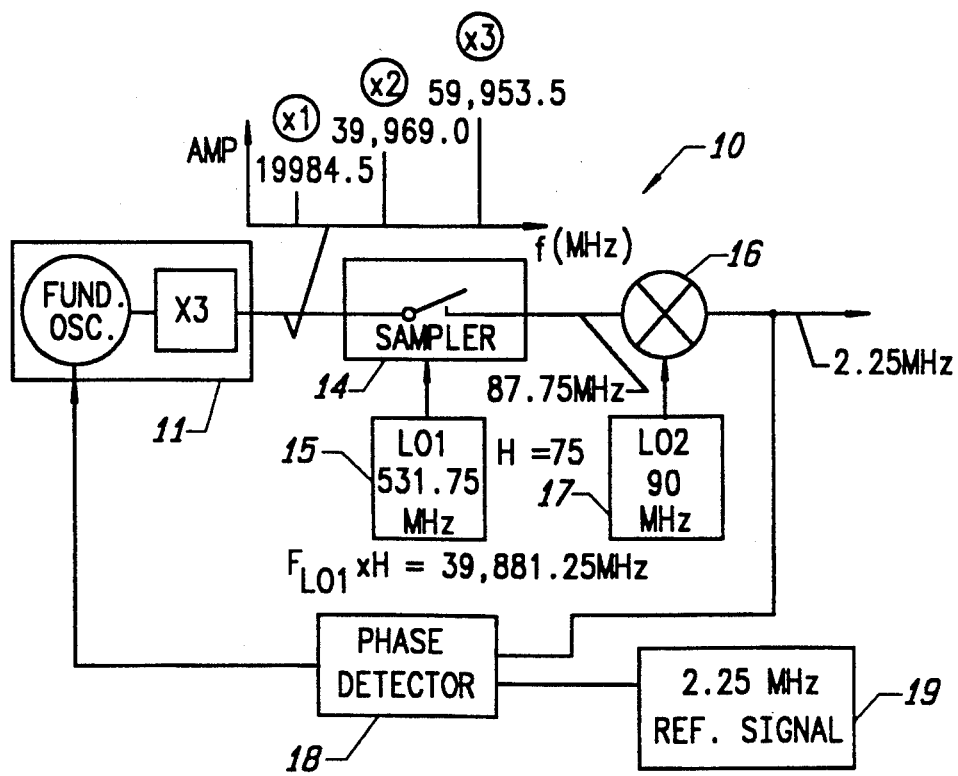
FIG. 3 is a block diagram of the apparatus of FIG. 2 showing how the apparatus of FIG. 2 can operate to produce a subharmonic false lock.

Referring to FIG. 3, which comprises the same components as the apparatus of FIG. 2, it will be seen that with a first local oscillator frequency $F_{LO1}$ of 531.75 MHz there exists a harmonic frequency of 39881.25 MHz having a harmonic number of 75 which when mixed with the second harmonic frequency of the source 11, namely 39969.0 MHz, produces the first intermediate frequency signal $IF_1$ of 87.75 MHz which in turn produces a subharmonic false lock of the system.

Figure 4:
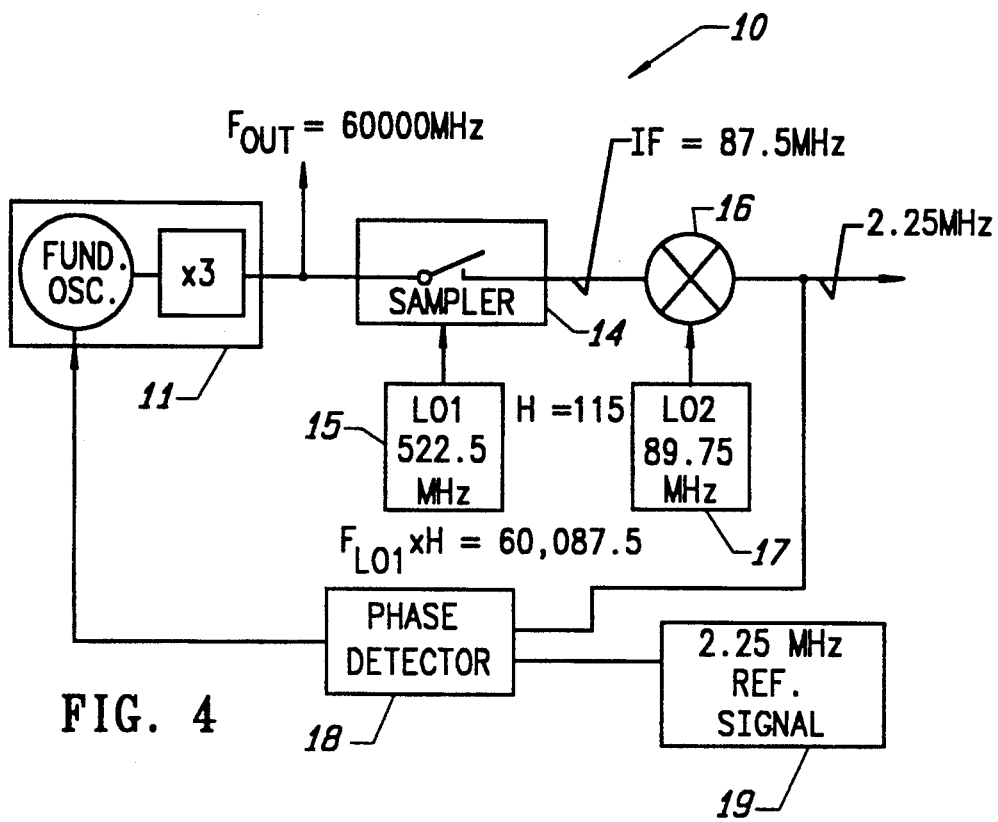
FIG. 4 is a block diagram of a sampler and frequency multiplier based phase-locked-loop source locking system which is being operated in accordance with the present invention.

Referring to FIG. 4, there is provided in accordance with the present invention a sampler and frequency multiplier based source locking system in which the harmonic number and the frequency of the first local oscillator 15 is determined in accordance with the present invention from a modification of the previously described prior known algorithm. That is to say, after calculating the harmonic number H which produces the lowest usable harmonic number H and the highest usable local oscillator frequency $F_{LO1}$ which maximizes sampler efficiency and minimizes local oscillator phase noise as described above, the initial number H as so determined is divided by M where M is the multiplication factor used for the frequency multiplier, e.g. 3. If the remainder of the division step is equal to 0, then H is increased by one. If the remainder of the division step is equal to 2/M, then H is increased by two. If the remainder of the division step is equal to 1/M then the magnitude of H as initially calculated is not adjusted. After the harmonic number H has been calculated and, if necessary, adjusted as described above, it is then used in the remaining steps of the algorithm to calculate a new frequency $F_{LO1}$ for the first local oscillator as well as the other parameters described above. For example, using the number H=113 as calculated above for the apparatus of FIG. 2, it is seen that the remainder of the division of 113 by the multiplication factor 3 is equal to 37⅔. Increasing H by two in accordance with the above-described algorithm as modified by the present invention increases H to 115. Thereafter, using H with a value of 115 and recalculating the parameters Z, A, K and $F_{LO1}$ as defined in steps 30, 40, 50 and 60 of the prior known algorithm produces a frequency $F_{LO1}$ of 522.5 MHz, as follows:

| 30 | $Z = 5365/(3 + H/1250)$ |
| --- | --- |
| | $Z = 5365/(3 + 115/1250)$ |
| | $Z = 5365/(3 + 0.092)$ |
| | $Z = 5365/(3.092)$ |
| | $Z = 1735.1229$ |
| 40 | $A = 1 + INT [(F_1 + Z)/H]$ |
| | $A = 1 + INT [(1200000 + 1735.1229)/115]$ |
| | $A = 1 + INT [(1201735.1)/115]$ |
| | $A = 1 + INT [10449.87]$ |
| | $A = 1 + 10449$ |
| | $A = 10450$ |
| 50 | $K = (H \times A - F_1 + 45)$ |
| | $K = (115 \times 10450 - 1200000 + 45)$ |
| | $K = (1201750 - 1200000 + 45)$ |
| | $K = 1795$ |
| 60 | $F_{LO1} = A \times .05$ |
| | $F_{LO1} = 10450 \times .05$ |
| | $F_{LO1} = 522.5$ |

With the first oscillator frequency set at 522.5 MHz it can be seen that the 115th harmonic of the first local oscillator frequency will produce an IF frequency $IF_1$ of 87.5 MHz at the fundamental frequency $F_s$ of 60 GHz. More importantly, as shown in FIG. 5, the frequency of the first local oscillator as thus calculated eliminates a subharmonic false lock within the source search range of $\pm 60$ MHz.

Figure 5:
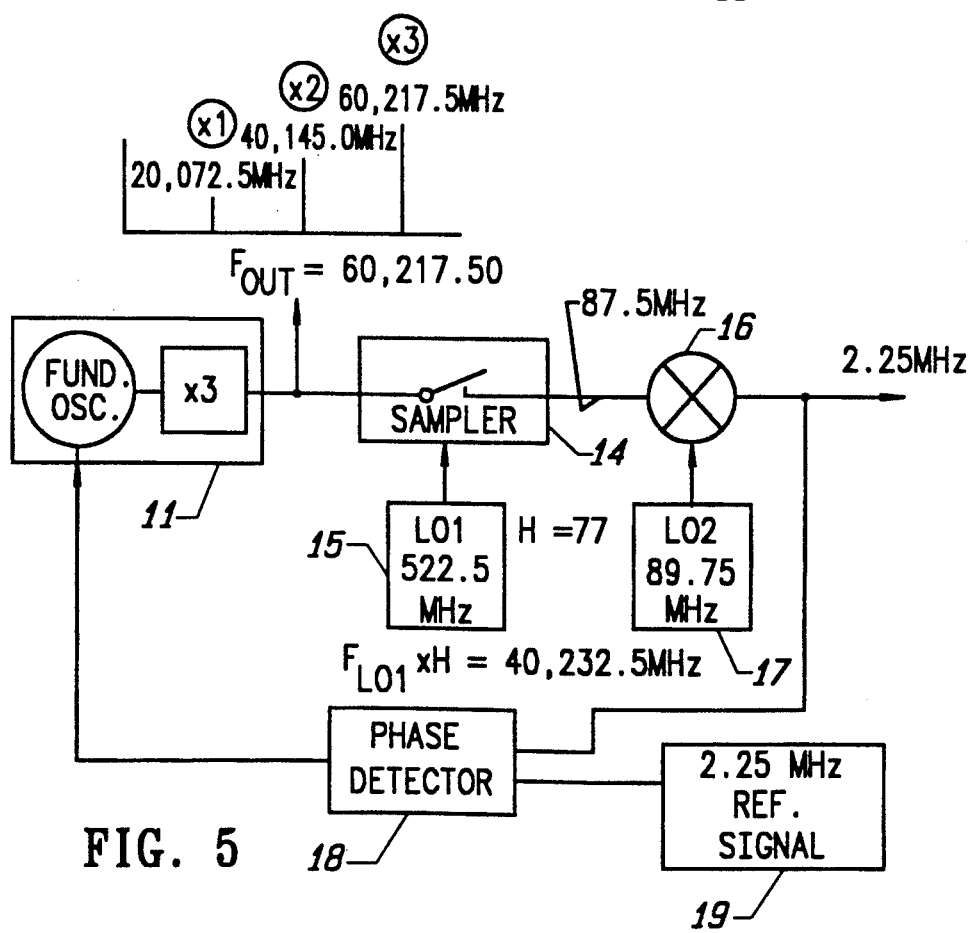
FIG. 5 is a block diagram of the apparatus of FIG. 4 which shows the elimination of subharmonic false locking when the first local oscillator is operated at a frequency which has been determined according to the present invention.

Referring to FIG. 5, it will be seen that with an $F_{LO1}$ of 522.5 MHz the closest harmonic lock that can occur is when the source is tuned during a search for a lock up to a frequency $F_s$ of 60217.50 MHz. If this were to occur, the lock would result from the second subharmonic 40145.0 MHz of the source and the 77th harmonic, 40232.50 MHz, of oscillator 15. However, since the frequency of 60217.50 MHz is much more than the maximum source search range to guarantee proper locking, e.g. $\pm 60$ MHz of the source 11, subharmonic false locking has been eliminated.

From the foregoing, it can be seen that the algorithm of the present invention clearly extends the maximum source search range while at the same time eliminating subharmonic false locks.

While a preferred embodiment of the present invention is described above, it is contemplated that various modifications may be made thereto without departing from the spirit and scope of the present invention. Accordingly, it is intended that the embodiment described be considered only as an illustration of the present invention and that the scope thereof should not be limited thereto but be determined by reference to the claims hereinafter provided and their equivalents.

What is claimed is:

1. In a sampler based phase-locked-loop having a signal source and a local oscillator, said signal source having a source oscillator and a frequency multiplier for multiplying the frequency of said source oscillator by a factor M for providing an output signal having a fundamental frequency $F_s$ and a plurality of subharmonic frequencies, and said phase-locked-loop having a source search range, a method for preventing a subharmonic false lock of said phase-locked-loop comprising the step of:

operating said local oscillator at a predetermined frequency $F_{LO1}$ such that said phase-locked-loop is prevented from locking onto a subharmonic of said source frequency $F_s$ as said phase-locked-loop searches for a lock within said source search range.

2. A method according to claim 1 wherein said fundamental frequency $F_s$ is approximately 60 GHz and said step of operating said local oscillator at a predetermined frequency $F_{LO1}$ comprises the step of operating said local oscillator at a predetermined frequency $F_{LO1}$ within a frequency range of from 357 MHz to 536 MHz.

3. A method according to claim 1 wherein said fundamental frequency $F_s$ is approximately 60 GHz and said step of operating said local oscillator at a predetermined frequency $F_{LO1}$ comprises the step of operating said local oscillator at a predetermined frequency $F_{LO1}$ of approximately 522.5 MHz.

4. A method according to claim 1 wherein said step of operating said local oscillator at said predetermined frequency $F_{LO1}$ comprises the step of operating said local oscillator at a predetermined frequency $F_{LO1}$ which has been determined in accordance with the following algorithm:

| | |
|---|---|
| (a) | $F1 = INT(20 \times F_s)$ |
| (b) | $H = 1 + INT(F_1 + 1788)/10730$ |
| (c) | $R = H/M$ |
| (d) | If the remainder in step (c) is 0, then increase H in the following equations by 1 |
| (e) | If the remainder in step (c) is 2/M, then increase H in the following equations by 2 |
| (f) | If the remainder in step (c) is 1/M, then H in the following equations remains unchanged |
| (g) | $Z = 5365/(3 + H/1250)$ |
| (h) | $A = 1 + INT [(F_1 + Z)/H]$ |
| (i) | $F_{LO1} = A \times .05$ | wherein
INT is the integer value of the parenthetical terms associated therewith;
$F_s$ is the fundamental output frequency of the source in megahertz;
H is the harmonic number of the local oscillator;
M is the factor by which the source oscillator frequency is multiplied; and
$F_1$, R, Z and A are parameters used in calculating the frequency $F_{LO1}$ in megahertz.

5. A method according to claim 4 wherein M is equal to 3.

6. A method according to claim 4, wherein $F_s$ is equal to 60000 MHz and M is equal to 3.

* * * * *

UNITED STATES PATENT AND TRADEMARK OFFICE
CERTIFICATE OF CORRECTION

PATENT NO. : 5,019,790

DATED : May 28, 1991

INVENTOR(S) : PETER M. KAPETANIC

It is certified that error appears in the above-identified patent and that said Letters Patent is hereby corrected as shown below:

Column 7, line 18 should read "(a) $F_1 = INT(20 \times F_s)$".

Signed and Sealed this

Twenty-ninth Day of September, 1992

Attest:

DOUGLAS B. COMER

*Attesting Officer*  *Acting Commissioner of Patents and Trademarks*